(12) United States Patent
Shur et al.

(10) Patent No.: US 11,031,210 B2
(45) Date of Patent: Jun. 8, 2021

(54) CHARGED PARTICLE DETECTION SYSTEM

(71) Applicant: EL-MUL TECHNOLOGIES LTD, Rehovot (IL)

(72) Inventors: Dmitry Shur, Holon (IL); Eli Cheifetz, Ramat Gan (IL); Armin Schon, Nes-Ziona (IL)

(73) Assignee: EL-MUL TECHNOLOGIES LTD., Rehovot (IL)

( * ) Notice: Subject to any disclaimer, the term of this patent is extended or adjusted under 35 U.S.C. 154(b) by 0 days.

(21) Appl. No.: 16/810,879

(22) Filed: Mar. 6, 2020

(65) Prior Publication Data

US 2020/0312609 A1    Oct. 1, 2020

Related U.S. Application Data

(60) Provisional application No. 62/814,604, filed on Mar. 6, 2019.

(51) Int. Cl.
| | |
|---|---|
| *H01J 37/244* | (2006.01) |
| *H01J 37/22* | (2006.01) |
| *G02B 27/10* | (2006.01) |
| *H01J 37/05* | (2006.01) |

(52) U.S. Cl.
CPC ........ *H01J 37/244* (2013.01); *G02B 27/1006* (2013.01); *H01J 37/05* (2013.01); *H01J 37/222* (2013.01); *H01J 2237/2443* (2013.01); *H01J 2237/2445* (2013.01); *H01J 2237/2448* (2013.01); *H01J 2237/24475* (2013.01); *H01J 2237/24495* (2013.01)

(58) Field of Classification Search
CPC ........ H01J 37/244; H01J 37/05; H01J 37/222; H01J 2237/2443; H01J 2237/2445; H01J 2237/24475; H01J 2237/2448; H01J 2237/24495; G02B 27/1006
USPC ............. 250/306, 307, 309, 310, 311, 492.1, 250/492.2, 492.21, 492.22, 492.23, 492.3
See application file for complete search history.

(56) References Cited

U.S. PATENT DOCUMENTS

| | | | | |
|---|---|---|---|---|
| 2015/0276947 | A1* | 10/2015 | Hoenk | G01T 1/248 250/363.03 |
| 2016/0312117 | A1* | 10/2016 | Wieczorek | G01T 1/2018 |
| 2017/0157428 | A1* | 6/2017 | Lee | A61N 5/1067 |
| 2019/0056515 | A1* | 2/2019 | Kobayashi | G01T 1/2008 |

* cited by examiner

*Primary Examiner* — Nicole M Ippolito

(57) ABSTRACT

A scintillator assembly including an entrance surface for receiving charged particles into the scintillator assembly, the charged particles including first charged particles at a first energy level and second charged particles at a second energy level. A first scintillator structure configured for receiving the first charged particles and generating a corresponding first signal formed of first photons with a first wavelength of λ1, a second scintillator structure configured for receiving the second charged particles and generating a corresponding second signal of second photons with a second wavelength of λ2, and an emitting surface for egress of a combined signal from the scintillator assembly, the combined signal including the first and second photons, and at least one beam splitter for receiving the combined signal and separating the combined signal to first and second photons.

10 Claims, 9 Drawing Sheets

CHARGED PARTICLE DETECTION SYSTEM

CROSS-REFERENCE TO RELATED APPLICATIONS

This Application claims priority benefit from U.S. Provisional Application No. 62/814,604, filed Mar. 6, 2019, entitled "Multilayer Scintillator Assembly" the disclosure of which is incorporated herein by reference in its entirety.

TECHNICAL FIELD

This application relates generally to charged particle detection systems and particularly to charged particle detection systems comprising multilayer scintillators.

BACKGROUND

Charged particle beam systems employed for inspection and/or imaging purposes typically generate a primary beam, of electrons or ions, which is focused onto the surface of a specimen by a charged particle beam column. The detection process generally involves the collection of different types of charged particles, such as, inter alia, secondary electrons (SE), secondary ions (SI), backscattered electrons (BSE) and/or backscattered ions (BSI), sputtered ions, etc. which are emitted from the specimen as a result of the interaction of the primary charged particle beam with the specimen. Additional types of charged particles include tertiary electrons (SE3) and/or tertiary ions (SI3) emitted from any surface within the detection system (other than the surface of the specimen) due to impingement of backscattered electrons and/or backscattered ions, neutral atoms or other particles thereon.

In order to inspect or form an image of the specimen, it is advantages to selectively detect charged particles produced due to operation of a charged particle beam column irradiating a specimen.

The different types of charged particles possess different energy levels. For a non-limiting example, a first type of charged particles comprises the secondary electrons (SEs), which have low energies spanning from several eV up to several tens of eV, such as up to 50 eV. A second type of charged particles comprises the backscattered electrons (BSEs) which have higher energies up to the initial primary beam energy (elastic interaction), that span from 50 eV or even hundreds of eV up to several tens of keV. Due to the energy level differences, the different types of charged particles are emitted from different regions within an irradiated specimen. BSEs come from deeper regions of the specimen, whereas SE originate from surface regions. Thus, the BSEs and the SEs carry different types of information. The different type of information affects the resultant image of the specimen. BSE images show high sensitivity to differences in the atomic number. The higher the atomic number, the brighter the material appears in the image. SE imaging can provide more detailed surface information.

Charged particle detectors are utilized to detect the charged particles emitted from the specimen. Scintillators may be deployed in the charged particle detectors to transfer charged particle energy into a plurality of photons with a specific wavelength. Different types of charged particles may strike the scintillator. Exemplary systems utilizing the charged particle detectors comprise microscopy systems, such as Scanning Electrons Microscopes (SEMs). Conventional particle detectors detect the different types of charged particles in discrete, subsequent detection events, referred to as "grabs". For example, initially the charged particle detector will be arranged to detect a SE at a first detection event, namely a first grab, and process the SE data into a first image. Thereafter in a second detection event, namely a second grab, will the charged particle detector be arranged to detect the BSEs and process the BSE data into a second image.

SUMMARY

The following summary of the invention is included in order to provide a basic understanding of some aspects and features of the disclosure. This summary is not an extensive overview of the disclosure and as such it is not intended to particularly identify key or critical elements of the disclosure or to delineate the scope of the disclosure. Its sole purpose is to present some concepts of the disclosure in a simplified form as a prelude to the more detailed description that is presented below.

There is provided in accordance with some embodiments, a charged particle detection system configured for detecting charged particles of different energy levels emitted from a specimen, which is impinged upon by a particle beam. In a non-limiting example the charged particles comprise SEs and BSEs. The SEs are emitted out of a more superficial layer of the specimen while the BSEs come from deeper regions into the specimen, according to initial penetration depth of the primary particle beam. The charged particle detection system comprises a multilayer scintillator assembly. The multilayer scintillator assembly comprises at least two active layers. The charged particle energies are tuned correspondingly by use of proper bias of the multilayer scintillator assembly to attract the charged particles thereto, and accelerate them if required. Due to their lower energy, the SEs should reach the first scintillator layer, while higher energy BSEs should mostly reach the deeper second scintillator layer. The first layer generates light photons with the wavelength $\lambda 1$, while the second layer generates photons with the wavelength $\lambda 2$.

The signals from the two layers carry different image information, and now they can be separated according to their corresponding wavelengths. One non-limiting method to implement this separation is using a dichroic filter, which can reflect shorter wavelengths, but transmit longer wavelengths (above a predefined threshold) or vice versa.

There is thus provided in accordance with an embodiment of the present disclosure, a particle detection system including a multilayer scintillator assembly including at least two scintillator layers, wherein a first scintillator layer is configured to generate a first signal of photons with a first wavelength $\lambda 1$ in response to a charged particle of a first type impinging thereon, and a second scintillator layer is configured to generate a second signal of photons with a second wavelength $\lambda 2$ in response to a charged particle of a second type impinging thereon, and a beam splitter for separating the first signal from the second signal.

In some embodiments, the first scintillator layer overlies or underlies the second scintillator layer. In some embodiments, the beam splitter is engaged at least with a first photomultiplier device for receiving the photons with the first wavelength $\lambda 1$ and generating first photoelectrons therefrom, and a second photomultiplier device for receiving the photons with the second wavelength $\lambda 2$ and generating second photoelectrons therefrom.

In some embodiments, the beam splitter is engaged with the first photomultiplier device via a first light guide and the beam splitter is engaged with the second photomultiplier device via a second light guide.

In some embodiments, at least one of the first and second photomultiplier devices is a photomultiplier tube (PMT). In some embodiments, the particle detection system further include at least a first and second pre-amplifier for receiving respective first and second photoelectrons and amplifying the first and second photoelectrons, at least a first and second digitizing device for digitizing the respective amplified first and second photoelectrons, and at least a first and second processor for processing the respective digitized first and second photoelectrons, thereby producing a first image based on the first photoelectrons and a second image based on the second photoelectrons.

In some embodiments, the beam splitter includes a dichroic filter. In some embodiments, the multilayer scintillator assembly is segmented into two or more segments. In some embodiments, each of the two or more segments is engaged with a corresponding beam splitter.

There is thus provided in accordance with an embodiment of the present disclosure, a scintillator assembly including an entrance surface for receiving incident electrons into the scintillator assembly, the incident electrons including at least first incident electrons at a first energy level and second incident electrons at a second energy level, at least a first scintillator structure configured for receiving the first incident electrons and generating a corresponding first signal formed of photons with a first wavelength of $\lambda 1$, at least a second scintillator structure configured for receiving the second incident electrons and generating a corresponding second signal of photons with a second wavelength of $\lambda 2$, and an emitting surface for egress of a combined signal from the scintillator assembly, the combined signal including the photons with the first wavelength $\lambda 1$ and the photons with the second wavelength $\lambda 2$, and at least one beam splitter for receiving the combined signal and separating the combined signal to photons with the first wavelength $\lambda 1$ and the photons with the second wavelength $\lambda 2$.

There is thus provided in accordance with an embodiment of the present disclosure, a signal separation system for distinguishing between at least a first type of charged particle and a second type of charged particle emitted from a specimen, including a convertor assembly including at least a first layer configured to emit, in response to impingement of the first type of charged particle on the first layer, a first signal containing a first type of image information, and a second layer configured to emit, in response to impingement of the second type of charged particle on the second layer, a second signal containing a second type of image information, the first and second signals are emitted as a combined signal from the convertor assembly, and a signal separator assembly configured to receive the combined signal and separate the first signal from the second signal.

In some embodiments, the first signal is emitted at a first predetermined wavelength and the second signal is emitted at a second predetermined wavelength. In some embodiments, the convertor assembly includes a multilayer scintillator assembly including the first layer which includes a first scintillating layer and the second layer which includes a second scintillating layer. In some embodiments, the first type of charged particle include at least one of secondary electrons (SEs) and secondary ions (SIs) and the second type of charged particle include at least one of backscattered electrons (BSEs) and backscattered ions (BSIs). In some embodiments, the first and second signal are received synchronously by the signal separator. In some embodiments, wherein following separation of the first signal from the second signal by the signal separator, the separated first signal is directed to a first image processor for producing a first image containing the first image information and the separated second signal is directed to a second image processor for producing a second image containing the second image information. In some embodiments, the first image and the second image show image information captured synchronously. In some embodiments, the signal separation system is positions within a microscopy system.

There is thus provided in accordance with an embodiment of the present disclosure, a method for separating signals for distinguishing between at least a first type of charged particle and a second type of charged particle emitted from a specimen, including irradiating a specimen with a primary beam for emitting at least the first type of charged particle and the second type of charged particle impinging a first layer of a convertor assembly configured to emit, in response to impingement of the first type of charged particle on the first layer, a first signal containing a first type of image information, impinging a second layer of the convertor assembly configured to emit, in response to impingement of the second type of charged particle on the second layer, a second signal containing a second type of image information, wherein a combined signal including the first and second signal emits the convertor assembly, receiving the combined signal by a signal separator assembly, and separating the combined signal by the signal separator assembly into at least the first signal and the second signal.

In some embodiments, the separated first signal is amplified by a first photomultiplier and processed to provide an image containing the first type of image information and the separated second signal is amplified by a second photomultiplier and processed to provide an image containing the second type of image information.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION OF EMBODIMENTS

In the following description, various aspects of the present invention will be described. For purposes of explanation, specific configurations and details are arranged forth in order to provide a thorough understanding of the present invention. However, it will also be apparent to one skilled in the art that the present invention may be practiced without the specific details presented herein. Furthermore, well known features may be omitted or simplified in order not to obscure the present invention.

Figure 1:
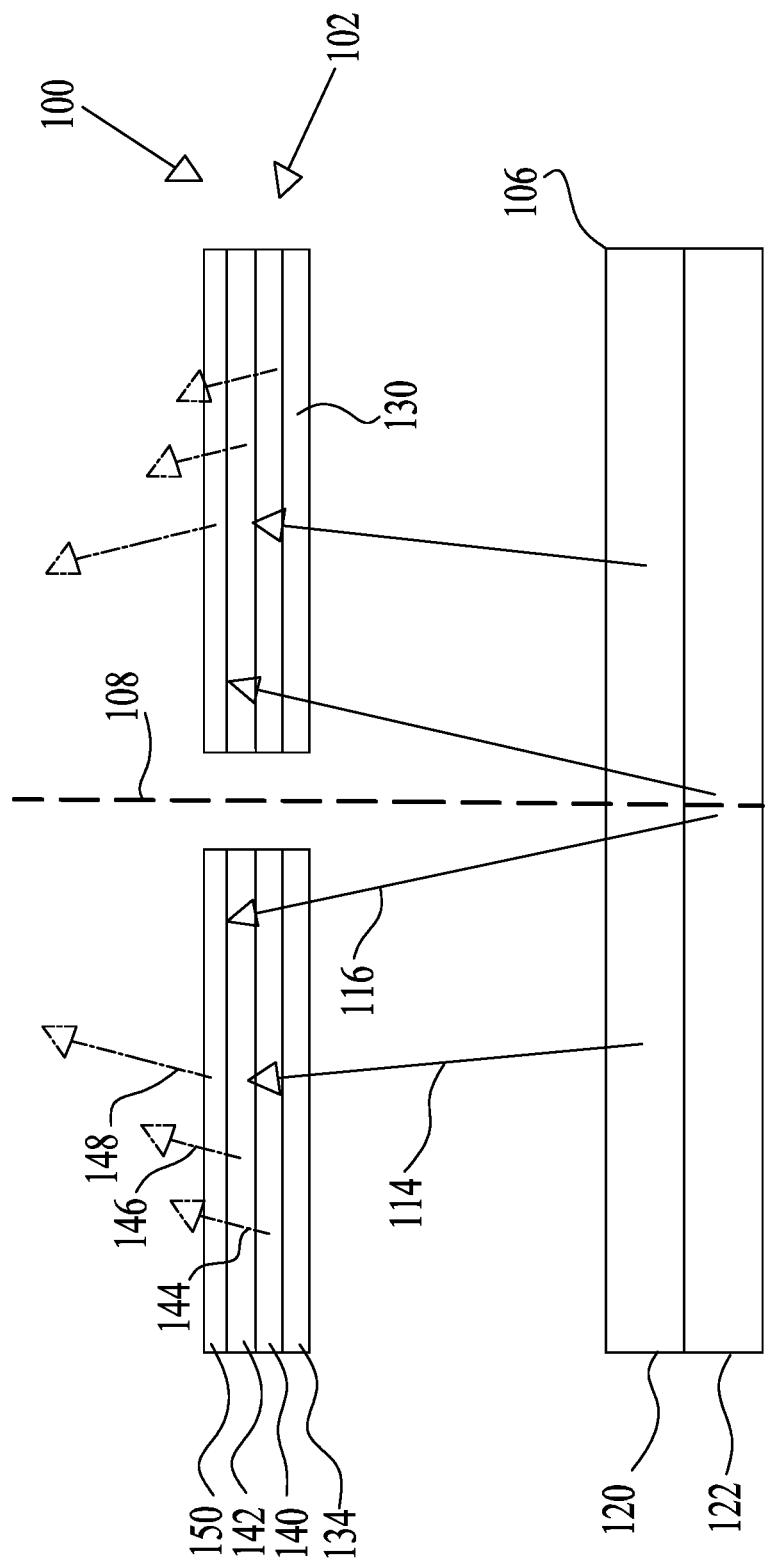
FIG. 1 is a simplified pictorial illustration of a charged particle detection system constructed and operative in accordance with an embodiment of the present disclosure.
Figure 2:
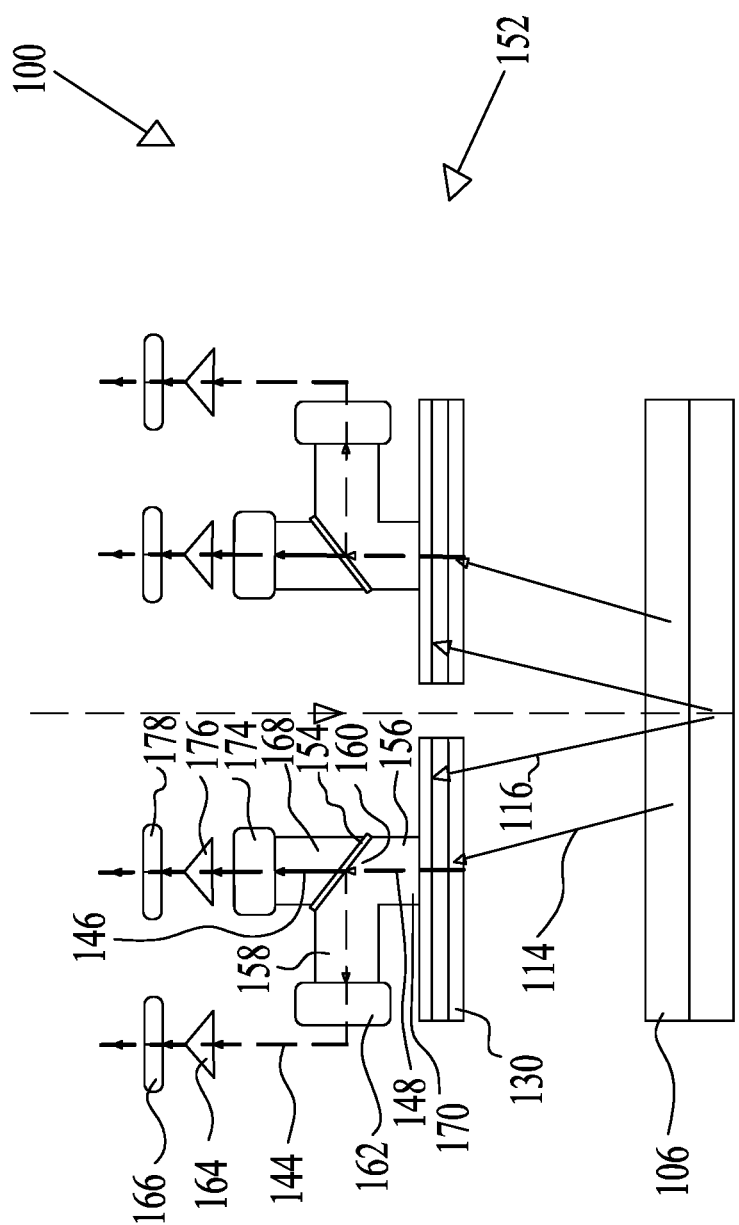
FIG. 2 is a simplified pictorial illustration of a charged particle detection system constructed and operative in accordance with an embodiment of the present disclosure.
Figure 3:
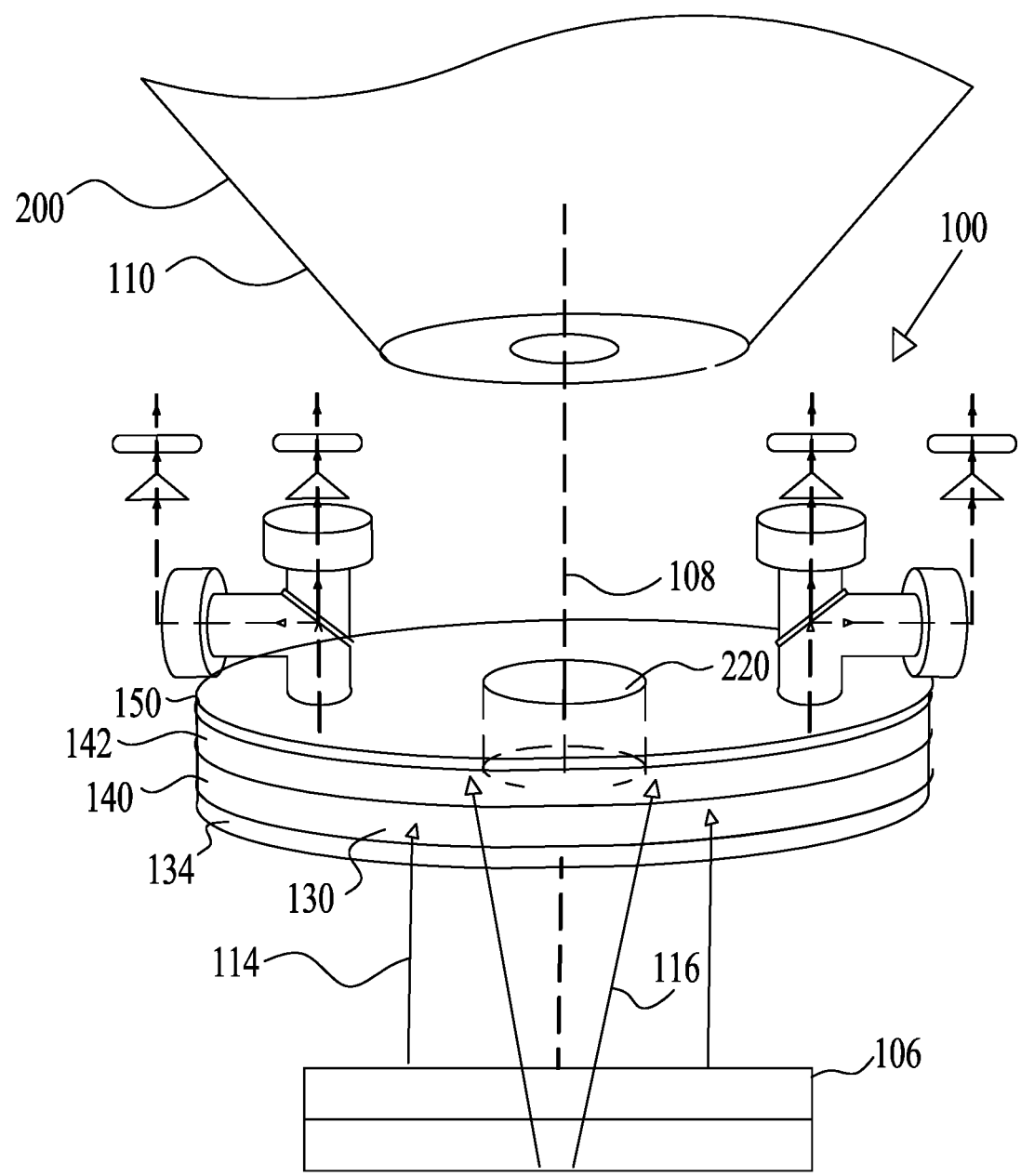
FIG. 3 is a simplified pictorial illustration of a charged particle detection system constructed and operative in accordance with an embodiment of the present disclosure.

FIGS. 1 and 2 are a simplified pictorial illustration of a charged particle detection system 100 constructed and operative in accordance with an embodiment of the present disclosure. The charged particle detection system 100 comprises a charged particle detector 102 configured for detecting charged particles of different energy levels emitted from a specimen 106 which is impinged upon by a charged particle beam 108 (namely the primary particle beam), generated by a particle beam column 110 (FIG. 3). Particle beam column 110 may comprise an electron beam column, a focused ion beam (FIB) column, a dual beam column, a helium beam column or any other suitable particle beam column. In a non-limiting example the particle beam column 110 is in a microscopy system, such as a SEM or a TEM (Transmission Electron Microscope) or the like. The particle beam 108 irradiates the specimen 106 causing charged particle (positive/negative ion and/or electron) emission from the specimen 106. The emitted particle propagates towards the charged particle detector 102.

The charged particles of different energy levels may comprise, in a non-limiting example, incident charged particles. The incident charged particles may comprise at least first incident charged particles at a first energy level and second incident charged particles at a second energy level. In the non-limiting embodiment of FIG. 1 the first incident charged particles at a first energy level comprise Secondary Electrons (SEs) 114 and the second incident charged particles at a second energy level comprise Backscattered Electrons (BSEs) 116.

In the embodiment of FIG. 1, the SEs 114 are shown to emit from a proximal (or namely an exterior or superficial) surface 120 of the specimen 106 relative to the beam column 110 while the BSE emit from a distal (or namely an interior or deeper) surface 122 of the specimen 106.

In other embodiments, the SEs 114 and BSEs 116 may be both emitted from the exterior surface 120 or the interior surface 122 or alternatively, the SEs 114 may be emitted from the exterior surface 120 and BSEs 116 may be emitted from the interior surface 122.

The charged particle detector 102 comprises a multilayer scintillator assembly 130. The multilayer scintillator assembly 130 may be formed with an entrance surface 134 for receiving the incident charged particles into the multilayer scintillator assembly 130.

In some embodiments, the multilayer scintillator assembly 130 may be biased so as to attract the charged particles thereto. In a non-limiting example, the multilayer scintillator assembly 130 is positively biased, e.g. in the range of about 6 to 12 kV, to attract the SEs 114 and BSEs 116 or any other negatively charged particles and accelerate SEs 114 and BSEs 116 to higher energies. In a non limiting example, the multilayer scintillator assembly 130 may be biased in the range of 3-12 kV. In such a case generally the SE energies will be approximately 3-12 keV, while the BSE energies will span in the range of the SE energy level plus 50 eV to the primary particle beam energy level.

The entrance surface 134 may comprise any suitable material. In some embodiments the entrance surface 134 may comprise a reflective layer, such as comprising aluminum. The reflective layer may be used to reflect undesired, parasite light impinging upon the multilayer scintillator assembly 130 from a location other then the specimen 106. In some embodiments, the entrance surface 134 may be formed of a conductive material (such as aluminum) to prevent excessive charging of the multilayer scintillator assembly 130. In some embodiments, the entrance surface 134 may be omitted.

The multilayer scintillator assembly 130 comprises at least a first scintillator structure 140 and a second scintillator structure 142 and may comprise additional structures. In the embodiments of FIGS. 1 and 2, the first scintillator structure 140 is formed as a layer and underlies the second scintillator structure 142, formed as a layer as well.

The penetration depth measures an average depth reached by the charged article within the multilayer scintillator assembly 130 and is a function of the charged particle energy and stopping power of the scintillator structure materials of 140, 142 and entrance surface material 134. The stopping power is the retarding force acting on the charged particles, due to interaction with matter, such as the first and second scintillator structures 140 or 142, resulting in loss of the charged particle energy. In a non-limiting example, for electrons, the penetration depths may range from several hundreds of nanometers for electrons of about 5 keV (e.g. SEs) up to several microns for electrons at about 50 keV (e.g. BSEs).

In a non-limiting example, the thickness of the entrance surface 134 may be in the range of about 10-100 nanometers, the thickness of each of the first and second scintillator structures 140 or 142 may be in the range 100 nanometers to 10 microns, a thickness of an emitting surface 150, described hereinafter, may be about 100 microns or more. The penetration depth of the SEs 114 is such that it reaches within the scintillator structures 140 and the penetration depth of the BSEs 116 is such that it reaches within the second scintillator structure 142.

The first and second scintillator structures 140 and 142 may each be formed with a material configured to emit photons at a different, separable wavelength. In a non limiting example, the first scintillator structure 140 may be formed of a first material configured to emit photons at a first predetermined wavelength while the second scintillator structure 142 may be formed of a second material configured to emit photons at a second wavelength, which is in the range of 2-2000 nanometers (e.g. any one of 20, 50, 100, 200, 500 nanometers) greater than the first predetermined wavelength. In other words, the wavelength λ2 is in the range of 2-2000 nanometers (including values and subranges therebetween) greater than the wavelength λ1. The first and second materials may comprise any scintillating material, such as Gallium Nitride, Gallium Arsenide, GaAsAl. The first and second material may be different or may comprise the same material, e.g. Gallium Nitride, wherein the first material remains pure and the second material is doped or vice versa, or wherein both materials are doped to different degrees. In some embodiments, in a non-limiting example any one of the first and second scintillator structures 140 and 142, the entrance surface 134 and the emitting surface 150 may comprise quantum wells.

The first scintillator structure 140 is configured for receiving the first incident electrons, e.g. the SEs 114. In response, the first scintillator structure 140 generates a corresponding first signal 144 formed of photons with a first wavelength of λ1, carrying first image information. The second scintillator structure 142 is configured for receiving the second incident electrons, e.g. the BSEs 116. In response, the second scintillator structure 142 generates a corresponding second signal 146 formed of photons with a second wavelength of λ2, carrying second image information.

Though each scintillator structure emits a different signal, the photons 148 egressing from an emitting surface 150 of the multilayer scintillator assembly 130, comprise a combined signal of both the first signal λ1 and the second signal λ2 indistinguishably when egressing from an emitting surface 150. The signals may be separated by a signal separator assembly, as will be further described.

The emitting surface 150 may be configured in any suitable manner and may be formed of any suitable material, such as a transparent material, e.g. glass. The emitting surface 150 may serve as a substrate to the multilayer scintillator assembly 130 for providing mechanical stability.

The first and second scintillator structures 140 and 142, entrance surface 134 and the substrate 1050 are not shown to scale.

As seen in FIG. 2, the charged particle detection system 100 may comprise at least one signal processing subassembly 152 comprising at least one signal separator assembly 154, e.g. a beam splitter, for receiving the egressed photons 148 from the multilayer scintillator assembly 130 and further optically separating the photons 144 with the first wavelength λ1 from the photons 146 with the second wavelength λ2. Namely, in the embodiment of FIGS. 1 and 2, the beam splitter 154 separates the first signal generated by the SEs 114 from the second signal generated by the BSEs 116.

The signal separator assembly 154 may comprise any device for optically separating the combined signal, comprising of two different wavelengths λ1 and λ2, and emitted from the multilayer scintillator assembly 130, as a result of the first signal 144 and the second signal 146.

In some embodiments, the signal separator assembly 154 comprising the beam splitter may comprise a dichroic filter, which can reflect shorter wavelengths, but transmit longer wavelengths (above a predefined threshold). In some embodiments, the beam splitter 154 may comprise a thin-film filter, absorbing filter, an interference filter or any device that is deployed to selectively pass light of a small range of colors while reflecting other colors or any other type of signal or information or vice versa. In another embodiment, the signal separator assembly 154 may comprise a position sensitive filters, that can be moved by precise motors. A pair of position sensitive filters (low pass and high pass) activated by precise motors or actuators can be also used for wavelength separation.

The signal processing subassembly 152 may comprise a light guide 156, formed in any suitable shape. Light guide 156 may be optically coupled to the multilayer scintillator assembly 130, so photons of the combined signal 148 propagate thereto. Then, the photons of the combined signal 148 arrives at the beam splitter 154, which may be mechanically attached or adhered to the light guide 156. In a non-limiting example, the first signal 144 is reflected from the beam splitter 154 and continues to propagate in a 90 degree, or at any other suitable angle, at a first branch 158 of the light guide 156 at a bifurcation junction 160 thereof. Subsequently, the first light guide branch 158 is coupled to a photo-cathode (PC) of a first photomultiplier tube (PMT1) 162 converting photons into first photoelectrons. The PMT1 162 amplifies the photoelectron signal to the level required to feed a pre-amplifier (Pre-amp 1) unit 164. Thereafter, at the output of the Pre-amp 1 164, the signal may be digitized and processed by an Image Channel1 166 to provide an image containing the first type of image information in the digital form or by any other suitable means. In some embodiments, any other devices for providing an amplified signal and electrical output, such as photomultipliers, may be provided, such as in a non-limiting example a Multi-Pixel Photon Counter (MPPC), also known as a silicon photomultiplier (SiPM).

The second signal 146 is transmitted by the beam splitter 154, and optically coupled to a second branch 168 of the light guide 156. The light guide 156 may be formed as a manifold with a base 170 bifurcating into at least two branches 158 and 168. The light guide 156 may be formed as a monolith unit or may comprise a plurality of light guides mechanically and optically adhered to each other at any angle or configuration. As seen in FIG. 2, the second branch 168 is mechanically attached or glued to the beam splitter 154 at the base 170. Subsequently, the second light guide branch 168 is coupled to a second photo-cathode (PC) of a second photomultiplier (PMT2) 174 converting photons into second photoelectrons. The PMT2 174 amplifies the photoelectron signal to the level required to feed a second pre-amplifier (Pre-amp 2) 176. Subsequently, at the output of the Pre-amp 2 176, the signal is digitized and processed by a second Image Channel2 178 to provide an image containing the second type of image information. Both channels may be independently controlled by separate PMTs, pre-amps, and video channel electronics.

In the embodiment of FIGS. 1 and 2 the first or second respective PMT 162 or 174 is deployed for augmenting the incoming light signal and for converting the photons to electrons. It is appreciated that any other suitable device for converting photons to electrons and/or augmenting the signal may be used, such as in a non-limiting example, an avalanche photo diode or a PIN diode, or MPCC/SiPM.

As seen in FIG. 3, the charged particle detection system 100 may be deployed in a scanning electron microscope (SEM) based tool (CDSEM, DRSEM, e-beam inspection, lab SEM, etc.). A SEM 200 comprises the particle beam column 110 for generating the electron beam 108 which irradiates the specimen 106. The charged particle detection system 100 is positioned within the SEM 200. As seen in FIG. 3, the multilayer scintillator assembly 130 may be formed with a central aperture 220 to allow the beam 108 to propagate therethrough to the specimen 106. Alternatively the multilayer scintillator assembly 130 may not include the aperture and may be positioned offset the electron beam 108 (not shown). In this case, the primary electrons and SE and BSE electrons should be separated by certain distribution of electric and magnetic fields within the charged particle detection system 100. In the system comprising a TEM 350 (FIG. 7) the aperture 220 may be obviated.

As can be seen from FIG. 1-3, the charged particle detection system 100 enables simultaneous imaging of SEs 114 and BSEs 116, or any other different types of charged particles, with subsequent separation of signals according to their optical wavelength by the signal separator assembly 154.

The charged particle detection system 100 is greatly advantageous.

In a conventional charged particle detection system 100 comprising a single layer scintillator, one would obtain a mixed signal 148 of the SEs 114 and BSEs 116 and there is no manner in which the analyst can distinguish between depths within the specimen 106. In other words, SE 114 and BSE 116 contrast will be mixed up within the same image, making analyzing information from different layers of the specimen 106, a complicated task. This mixed image based on the mixed signal 148 can be hardly analyzed due to low contrast of BSE 116 on the high background of SE signal 114. In some cases, SE 114 contrast can deteriorate due to presence of considerable amount of BSEs 116. As a result, the conventional type of scintillator detector would force an analyst to perform double grab measurements with changing SEM conditions between the grabs. The SEM (or TEM) conditions may refer to the SEM operating conditions, such as the setting of the primary beam (108) energy, the primary beam current and the like.

One grab would be arranged to maximize BSE contrasts, while another grab would be arranged optimal for SE contrasts. Double grab method is inferior for measuring overlay of the specimen 106 layers. The overlay may be defined as the lateral and/or longitudinal displacement degree (i.e. shift) of the specimen layers in respect to each other. In the art of semiconductor wafers the shift of the layers above a predetermined displacement may render the wafer in operable. Thus the overlay measurement is significant. Measuring the overlay during a single, simultaneous grab is advantageous. Besides yielding higher precision overlay measurement, measuring the overlay during a single grab is quicker and thus more cost effective.

The charged particle detection system 100 enables single grab measurement without a need to separate between BSE 116 and SE 114 contrasts by changing SEM (or TEM) conditions between grabs.

The charged particle detection system 100 enable inherent decoupling of BSE 116 and SE 114 information acquired in the same single grab in the SEM 200. Therefore, this method and apparatus improves the SEM overlay measurement MAM (move, acquire, measure) time and throughput, shortening the gap between SEM and optical overlay measurement performance. Decoupling between BSE and SE information, obtained in the same grab, should also improve other overlay measurement characteristics. For example, precision and matching of the measurement should be improved due to better image contrasts for both SE and BSE images. In other words, the charged particle detection system 100 enables distinguishing image information relating to the SEs 114 from image information relating the BSEs 116. Furthermore, since the BSEs penetrate a deeper layer in the specimen 106 than the SEs 114, the first and second image information obtained simultaneously at the same grab can be indicative of the depth within the specimen 106.

Moreover, measuring overlays in two successive grabs (i.e. double grab overlay measurement) unavoidably suffers from a system drift between the two grabs. As a result, SE and BSE images are shifted relative to each other. This deteriorates overlay measurement precision, matching, and accuracy. The method of the present disclosure is superior in terms of measurement precision, matching, accuracy, and throughput, at the same time.

Figure 4:
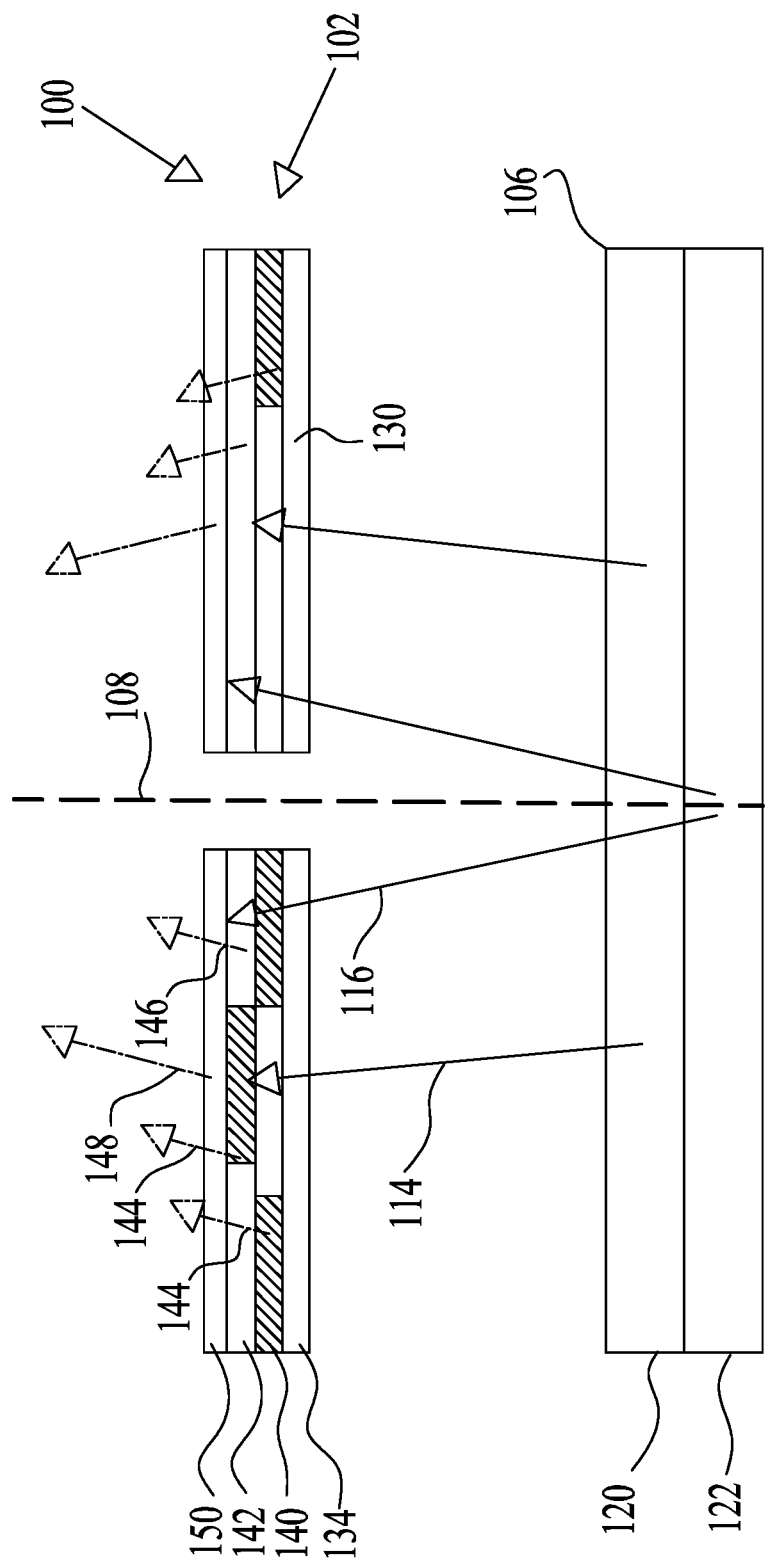
FIG. 4 is a simplified pictorial illustration of a charged particle detection system constructed and operative in accordance with an embodiment of the present disclosure.

In some embodiments, as seen in FIG. 4, the multilayer scintillator assembly 130 may be configured such that the first scintillator structure 140 and the second scintillator structure 142 are positioned laterally adjacent thereto, such as in a tiled configuration, for example. It is appreciated that multilayer scintillator assembly 130 may comprise any suitable configuration.

Figure 5A:
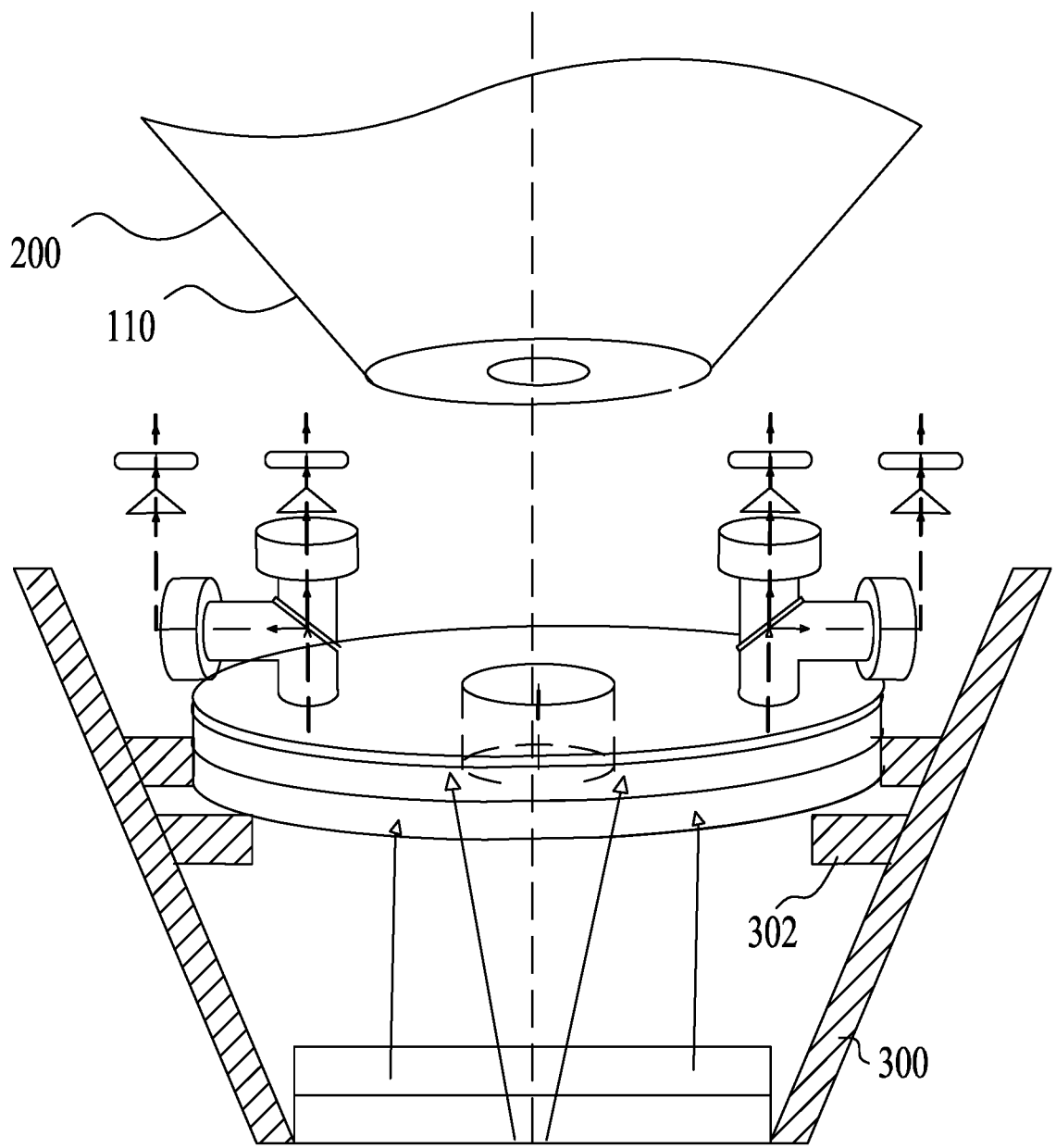
FIGS. 5A and 5B are each a simplified pictorial illustration of a charged particle detection system constructed and operative in accordance with an embodiment of the present disclosure.
Figure 5B:
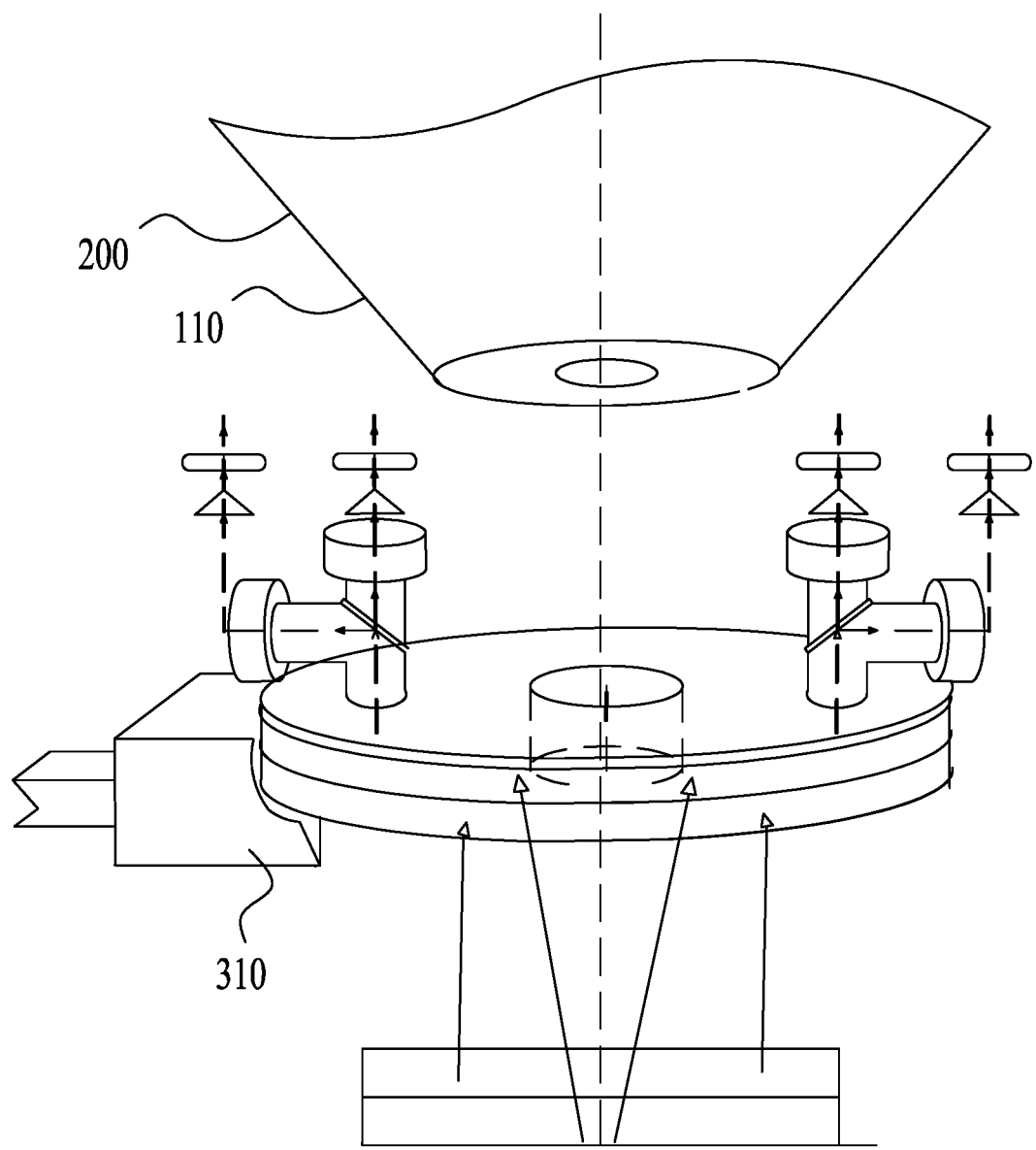

The charged particle detection system 100 may be secured within a chamber of the SEM 200 or any other beam system in any suitable manner. In one embodiment, as seen in FIG. 5A, the charged particle detection system 100 may be positioned within a supporting frame 300 comprising supporting beams 302. In another exemplary embodiment as seen in FIG. 5B, the charged particle detection system 100 is secured by a plurality of clamps or a single clamp 310.

Figure 6:
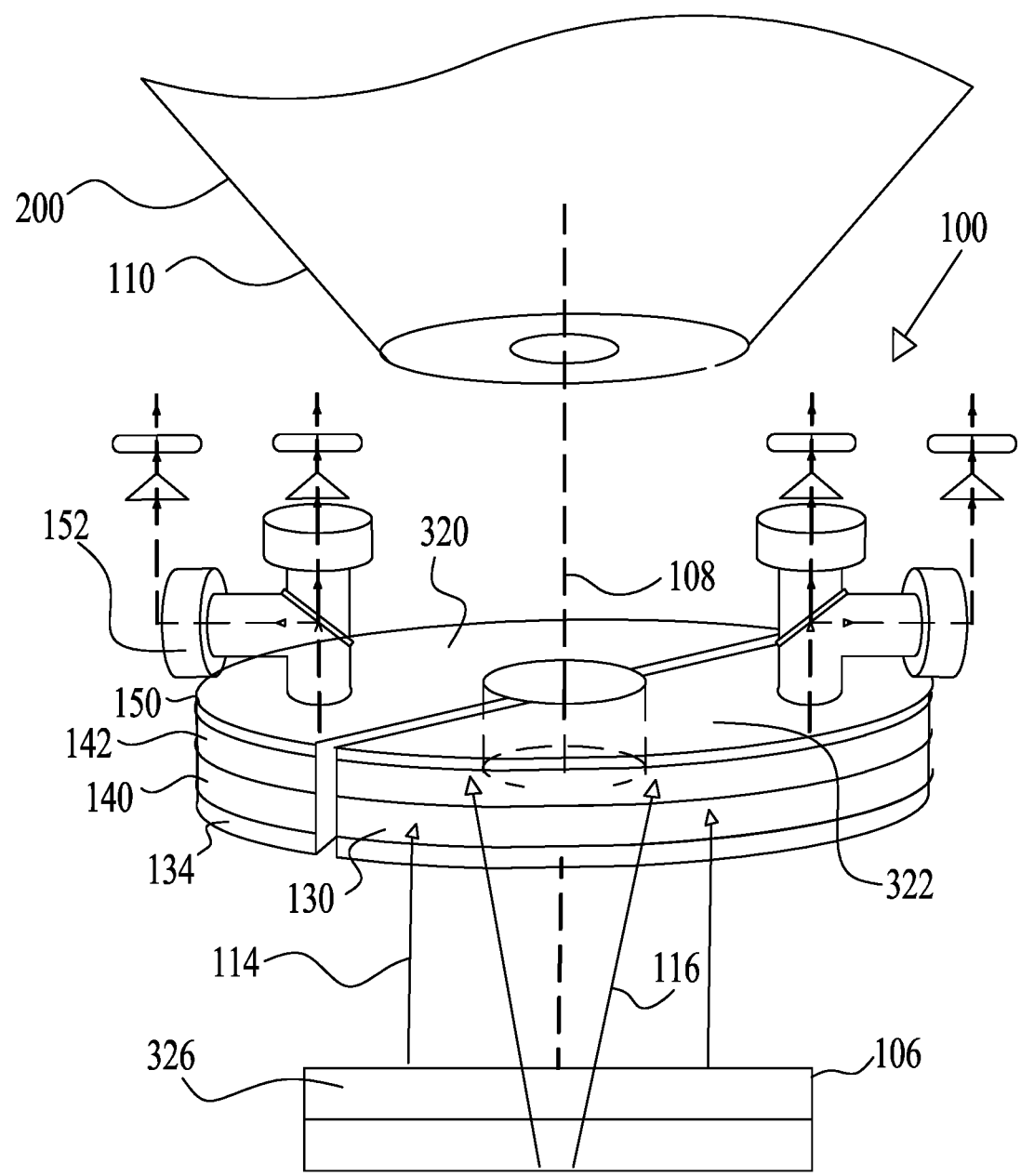
FIG. 6 is a simplified pictorial illustration of a charged particle detection system constructed and operative in accordance with an embodiment of the present disclosure.

As seen in FIG. 6, in some embodiments, the multilayer scintillator assembly 130 may be segmented into at least two segments 320 and 322 or more. Each segment may be equipped with its signal processing subassembly 152 including at least: a signal separator assembly 154, a light guide 156, a PMT 162 or other signal amplifier, pre-amplifier unit 164 and an image channel 166 (FIG. 2). Segmenting the multilayer scintillator assembly 130 allows for detecting the spatial location of a signal within the specimen 106. For example, a charged particle emitted from a left side portion 326 of the specimen 106 will reach the corresponding left segment 320 of the multilayer scintillator assembly 130. It is therefore known that an image produced by the signal processing subassembly 152 of the left segment is originated from the left side portion 326 of the specimen 106. In the embodiment of FIG. 6, the segments 320 and 322 may be segmented angularly into two or more slices. It is appreciated that the multilayer scintillator assembly 130 may be segmented in any suitable manner, such as concentrically, as shown in FIG. 8

Figure 7:
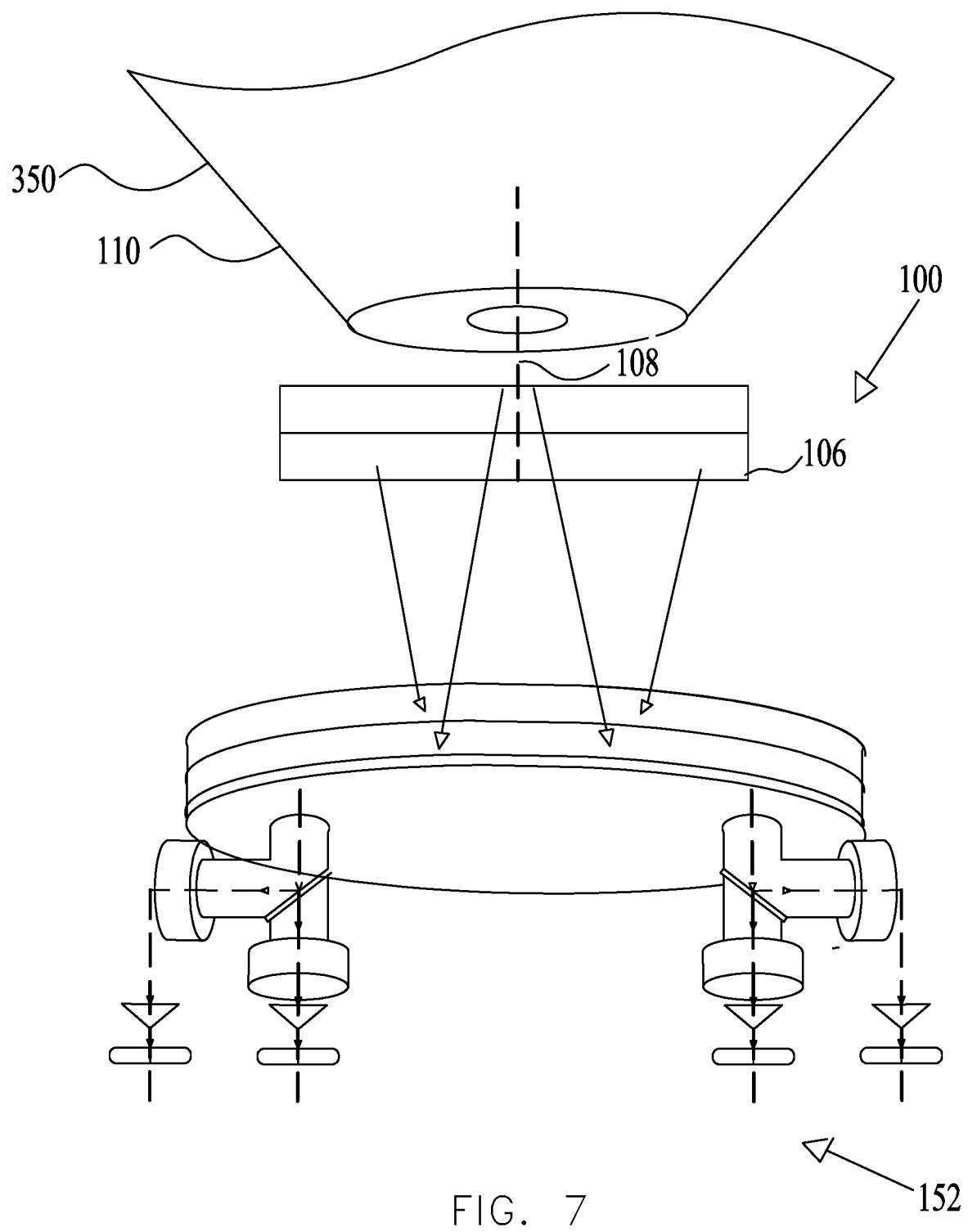
FIG. 7 is a simplified pictorial illustration of a charged particle detection system constructed and operative in accordance with an embodiment of the present disclosure.

Turning to FIG. 7, it is seen that the charged particle detection system 100 may be positioned within a TEM 350 or any other system comprising a particle beam column 110. In the TEM 350 the particle beam 108 is transmitted through the specimen 106. Accordingly, the charged particle detection system 100 may be positioned to underlie the specimen 106, such that the specimen 106 is intermediate the charged particle detection system 100 and the particle beam column 110. In FIG. 7 the charged particle detection system 100 is shown to be positioned upside down relative to the charged particle detection system 100 position in FIGS. 1-6.

Figure 8:
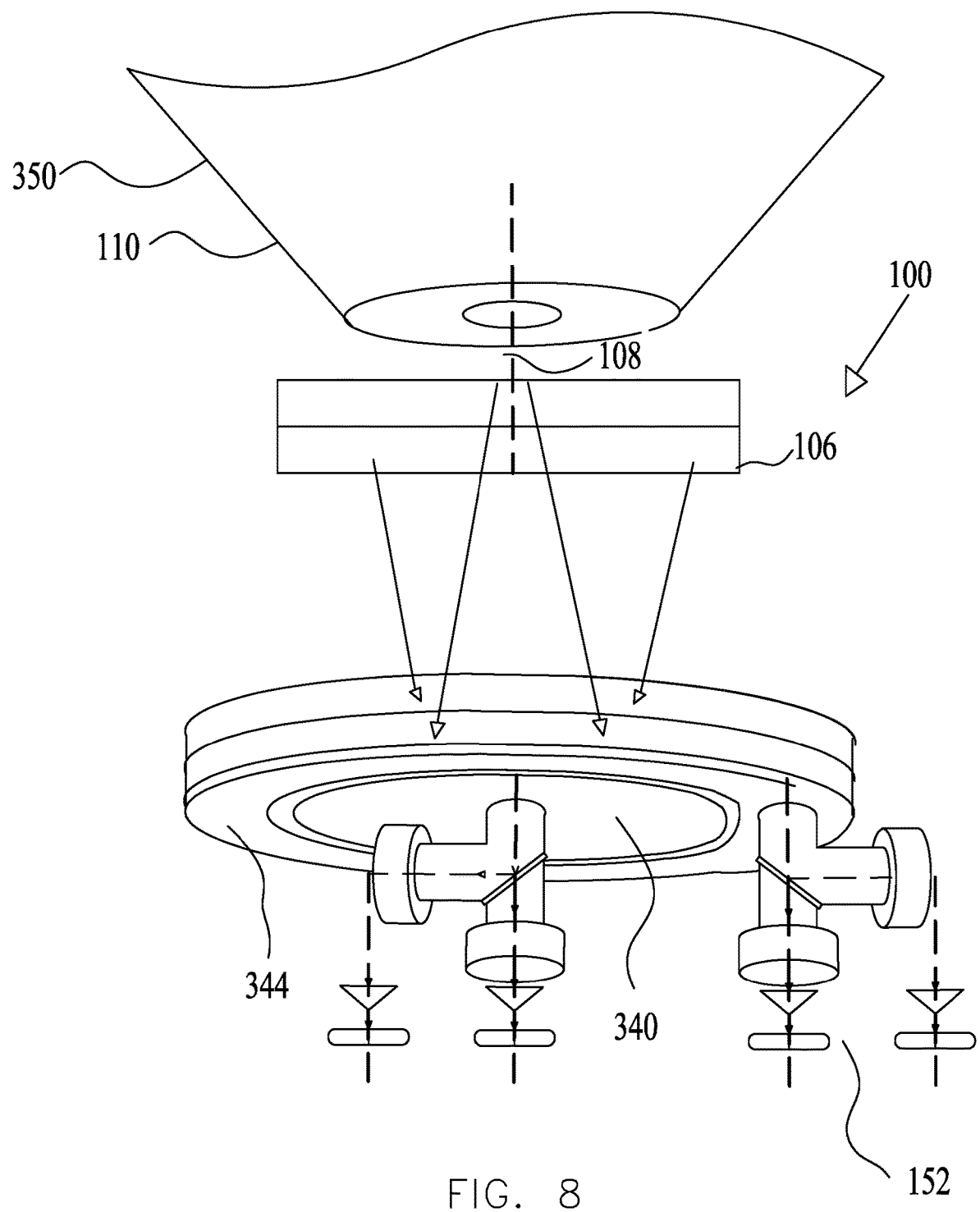
FIG. 8 is a simplified pictorial illustration of a charged particle detection system constructed and operative in accordance with an embodiment of the present disclosure.

As seen in FIG. 8, the multilayer scintillator assembly 130 may be segmented concentrically into a least an inner segment 340 and an outer segment 344 forming rings. This segment arrangement allows operating the TEM 350 in an imaging and diffraction mode to receive a corresponding respective bright field image from the inner segment 340 and a dark field image from the outer segment 344 at the same time and therefore a dark field image and a bright field image may be produced in the same grab.

It is appreciated that the concentrically segmented multilayer scintillator assembly of FIG. 8 can be employed within a SEM 200.

It is appreciated that the signal processing subassembly 152 of FIGS. 1-8 may comprise any suitable number of signal separator assemblies 154, light guides 156 and PMTs. Though in FIGS. 1-8 the signal processing subassembly 152 is shown to comprise two signal separator assemblies 154, light guides 156 and PMTs, a single signal separator assemblies 154, light guide 156 and PMT may be provided, as well as more than two signal separator assemblies 154, light guides 156 and PMTs.

In some embodiments, there may be provided a signal separation system for distinguishing between at least a first type of charged particle (e.g. an SE 114) and a second type of charged particle (e.g. a BSE 116) emitted from the specimen 106, comprising a convertor assembly (e.g. the multilayer scintillator assembly 130) comprising at least a first layer configured to emit, in response to impingement of the first type of charged particle on the first layer, a first signal containing a first type of image information and a second layer configured to emit, in response to impingement of the second type of charged particle on the second layer, a second signal containing a second type of image information. The first and second signal are emitted as a combined signal from the convertor assembly and a signal separator assembly 154 configured to receive the combined signal and separate the first signal from the second signal.

It is appreciated that the charged particles are described herein as comprising SEs 114 and BSEs 116, yet is appreciated that the system and method of the disclosure are applicable to any charged particles, such as in a non-limiting example, SIs, BSIs, SE3, SI3, sputtered ions and the like.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be an example and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure. Some embodiments may be distinguishable from the prior art for specifically lacking one or more features/elements/functionality (i.e., claims directed to such embodiments may include negative limitations).

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Any and all references to publications or other documents, including but not limited to, patents, patent applications, articles, webpages, books, etc., presented anywhere in the present application, are herein incorporated by reference in their entirety. Moreover, all definitions, as defined and used herein, should be understood to control over dictionary definitions, definitions in documents incorporated by reference, and/or ordinary meanings of the defined terms The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of," "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A particle detection system comprising:
    a multilayer scintillator assembly comprising at least two scintillator layers, wherein a first scintillator layer is configured to generate a first signal of photons with a first wavelength $\lambda 1$ in response to a charged particle of a first type impinging thereon, and a second scintillator layer is configured to generate a second signal of photons with a second wavelength $\lambda 2$ in response to a charged particle of a second type impinging thereon; and
    a beam splitter for separating the first signal from the second signal.

2. A particle detection system according to claim 1, wherein the first scintillator layer overlies or underlies the second scintillator layer.

3. A particle detection system according to claim 1, wherein the beam splitter is engaged at least with:
    a first photomultiplier device for receiving the photons with the first wavelength $\lambda 1$ and generating first photoelectrons therefrom; and
    a second photomultiplier device for receiving the photons with the second wavelength $\lambda 2$ and generating second photoelectrons therefrom.

4. A particle detection system according to claim 3, wherein the beam splitter is engaged with the first photomultiplier device via a first light guide and the beam splitter is engaged with the second photomultiplier device via a second light guide.

5. A particle detection system according to claim 3, wherein at least one of the first and second photomultiplier devices is a photomultiplier tube (PMT).

6. A particle detection system according to claim 3 further comprising:
    at least a first and second pre-amplifier for receiving respective first and second photoelectrons and amplifying the first and second photoelectrons;
    at least a first and second digitizing device for digitizing the respective amplified first and second photoelectrons; and
    at least a first and second processor for processing the respective digitized first and second photoelectrons, thereby producing a first image based on the first photoelectrons and a second image based on the second photoelectrons.

7. A particle detection system according to claim 1, wherein the beam splitter comprises a dichroic filter.

8. A particle detection system according to claim 1, wherein the multilayer scintillator assembly is segmented into two or more segments.

9. A particle detection system according to claim 8, and wherein each of the two or more segments is engaged with a corresponding beam splitter.

10. A particle detection system comprising:
    a scintillator assembly comprising:
    an entrance surface for receiving incident electrons into the scintillator assembly, the incident electrons comprising at least first incident electrons at a first energy level and second incident electrons at a second energy level;
    at least a first scintillator structure configured for receiving the first incident electrons and generating a corresponding first signal formed of photons with a first wavelength of $\lambda 1$;
    at least a second scintillator structure configured for receiving the second incident electrons and generating a corresponding second signal of photons with a second wavelength of $\lambda 2$; and
    an emitting surface for egress of a combined signal from the scintillator assembly, the combined signal comprising the photons with the first wavelength $\lambda 1$ and the photons with the second wavelength $\lambda 2$; and
    at least one beam splitter for receiving the combined signal and separating the combined signal to photons with the first wavelength $\lambda 1$ and the photons with the second wavelength $\lambda 2$.

* * * * *